US010043793B2

(12) United States Patent
Lai

(10) Patent No.: US 10,043,793 B2
(45) Date of Patent: Aug. 7, 2018

(54) SEMICONDUCTOR DEVICE AND CIRCUIT

(71) Applicant: TAIWAN SEMICONDUCTOR MANUFACTURING COMPANY LTD., Hsinchu (TW)

(72) Inventor: Ming-Fang Lai, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/014,880

(22) Filed: Feb. 3, 2016

(65) Prior Publication Data

US 2017/0221877 A1 Aug. 3, 2017

(51) Int. Cl.
*H01L 27/02* (2006.01)

(52) U.S. Cl.
CPC ...... *H01L 27/0274* (2013.01); *H01L 27/0251* (2013.01)

(58) Field of Classification Search
CPC ....... H02H 9/00; H01L 27/0266; H01L 27/02; H01L 27/0251; H01L 27/0274; H01L 27/0288; H01L 27/0292
See application file for complete search history.

(56) References Cited

U.S. PATENT DOCUMENTS 6,465,768 B1 * 10/2002 Ker ................. H01L 21/823842 250/214.1
6,903,913 B2 * 6/2005 Ker ..................... H01L 27/0266 361/111
9,478,979 B2 * 10/2016 Domanski ........... H01L 27/0285
2003/0076645 A1 * 4/2003 Ker ..................... H01L 27/0266 361/111
2003/0147190 A1 * 8/2003 Ker ..................... H01L 27/0259 361/56
2005/0200396 A1 * 9/2005 Hsu ..................... H01L 27/0262 327/313
2005/0275027 A1 * 12/2005 Mallikarjunaswamy ................. H01L 27/0266 257/355
2007/0073807 A1 * 3/2007 Bobde ................... H01L 29/407 709/203
2008/0316663 A1 * 12/2008 Martin ................ H01L 27/0285 361/56
2009/0213508 A1 * 8/2009 Hsihe .................. H01L 27/0266 361/56
2009/0231766 A1 * 9/2009 Chang ................. H01L 27/0277 361/56
2010/0128401 A1 * 5/2010 Lai ...................... H01L 27/0266 361/56
2010/0246076 A1 * 9/2010 Campi, Jr. .......... G06F 17/5045 361/56

(Continued)

*Primary Examiner* — Fazli Erdem
(74) *Attorney, Agent, or Firm* — WPAT, P.C., Intellectual Property Attorneys; Anthony King

(57) ABSTRACT

The present disclosure relates to a semiconductor device. The semiconductor device includes a substrate, a first doping region, a second doping region, a third doping region, a first transient block unit and a second transient block unit. The first doping region is in the substrate. The second doping region is in the first doping region. The third doping region is in the first doping region. The first transient block unit is electrically connected to the second doping region. The second transient block unit is electrically connected between the third doping region and the first transient block unit.

20 Claims, 17 Drawing Sheets

(56) References Cited

U.S. PATENT DOCUMENTS

| | | | | |
|---|---|---|---|---|
| 2011/0089535 | A1* | 4/2011 | Chen | H01L 23/60 257/565 |
| 2014/0027810 | A1* | 1/2014 | Yang | H01L 27/06 257/133 |
| 2014/0185167 | A1* | 7/2014 | Peng | H02H 9/046 361/56 |
| 2014/0291765 | A1* | 10/2014 | Ouyang | H01L 27/0277 257/355 |
| 2014/0339601 | A1* | 11/2014 | Salcedo | H01L 27/0262 257/140 |
| 2014/0346563 | A1* | 11/2014 | Salcedo | H01L 27/0262 257/173 |
| 2015/0070804 | A1* | 3/2015 | de Raad | H01L 27/0274 361/56 |
| 2015/0229126 | A1* | 8/2015 | Domanski | H01L 27/0285 361/56 |
| 2016/0181236 | A1* | 6/2016 | Hung | H01L 27/0255 257/491 |

* cited by examiner

SEMICONDUCTOR DEVICE AND CIRCUIT

BACKGROUND

In semiconductor devices which utilize complementary metal-oxide semiconductor (CMOS) technology, parasitic npn and pnp bipolar junction transistors (BJTs) may be formed among source regions, drain regions, n-type wells, p-type wells, and substrates.

The parasitic BJTs may create problems when triggered. For example, triggered parasitic BJTs may cause short-circuiting between power (VDD) and ground (VSS) lines, which may result in destruction of an associated chip or failure of an associated electronic system.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
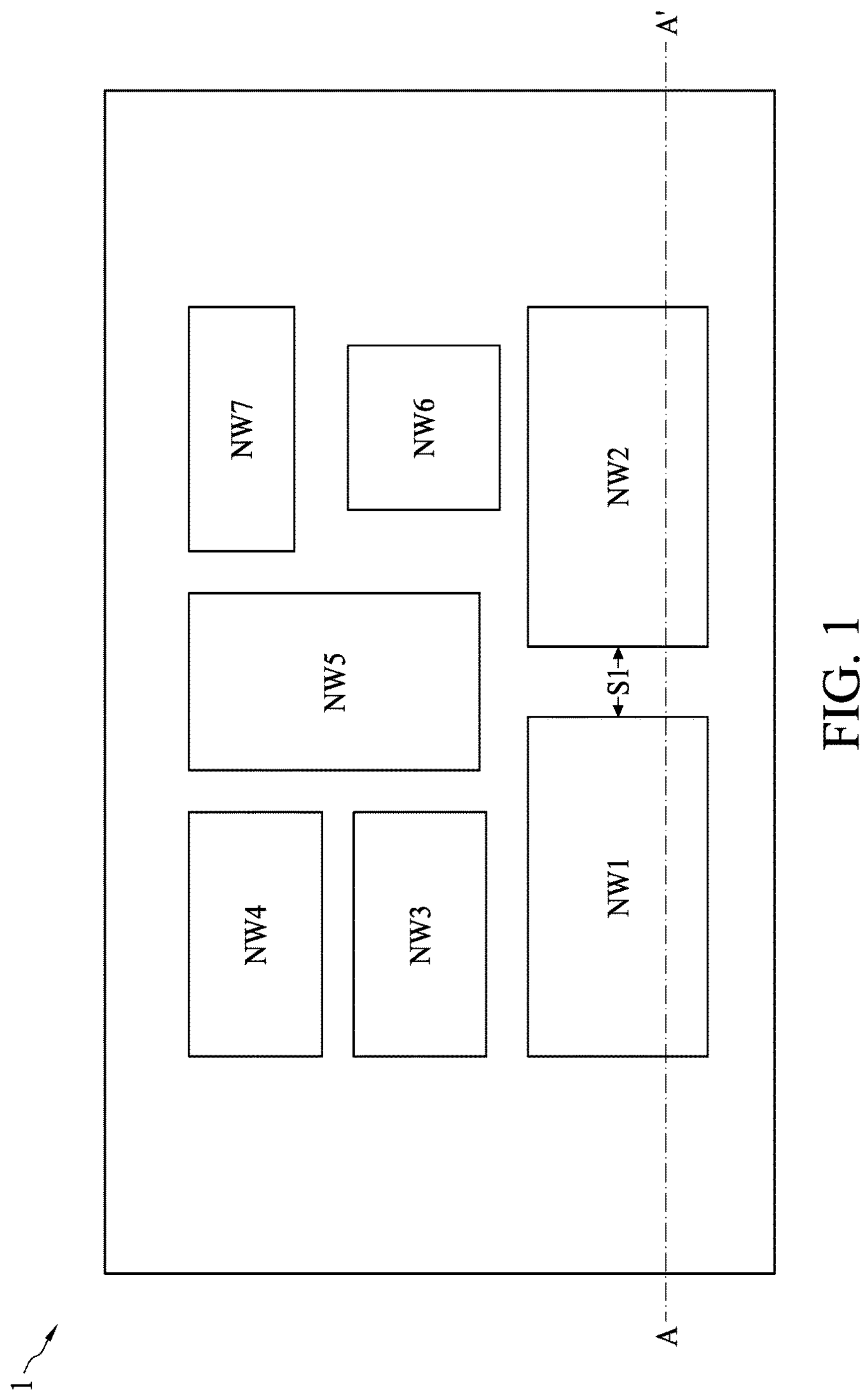
FIG. 1 illustrates a layout view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to the figures, wherein like numerals indicate like parts throughout the several views. FIG. 1 illustrates a layout view of a semiconductor device 1 in accordance with some embodiments of the present disclosure. Referring to FIG. 1, the semiconductor device 1 may be part of an integrated circuit (not separately numbered) that may include transistors (e.g. metal-oxide-semiconductor field-effect transistor (MOSFET)) electrically connected to different power supplies. In the present embodiment, the semiconductor device 1 includes a number of n-type well regions ("n-well") NW1, NW2, NW3, NW4, NW5, NW6 and NW7, which may be electrically connected to same or different power supplies. Although only n-type well regions NW1, NW2, NW3, NW4, NW5, NW6 and NW7 are illustrated in FIG. 1, however, it is contemplated that the semiconductor device 1 includes p-type well regions ("p-well") and other electronic components, e.g., passive components.

Figure 2A:
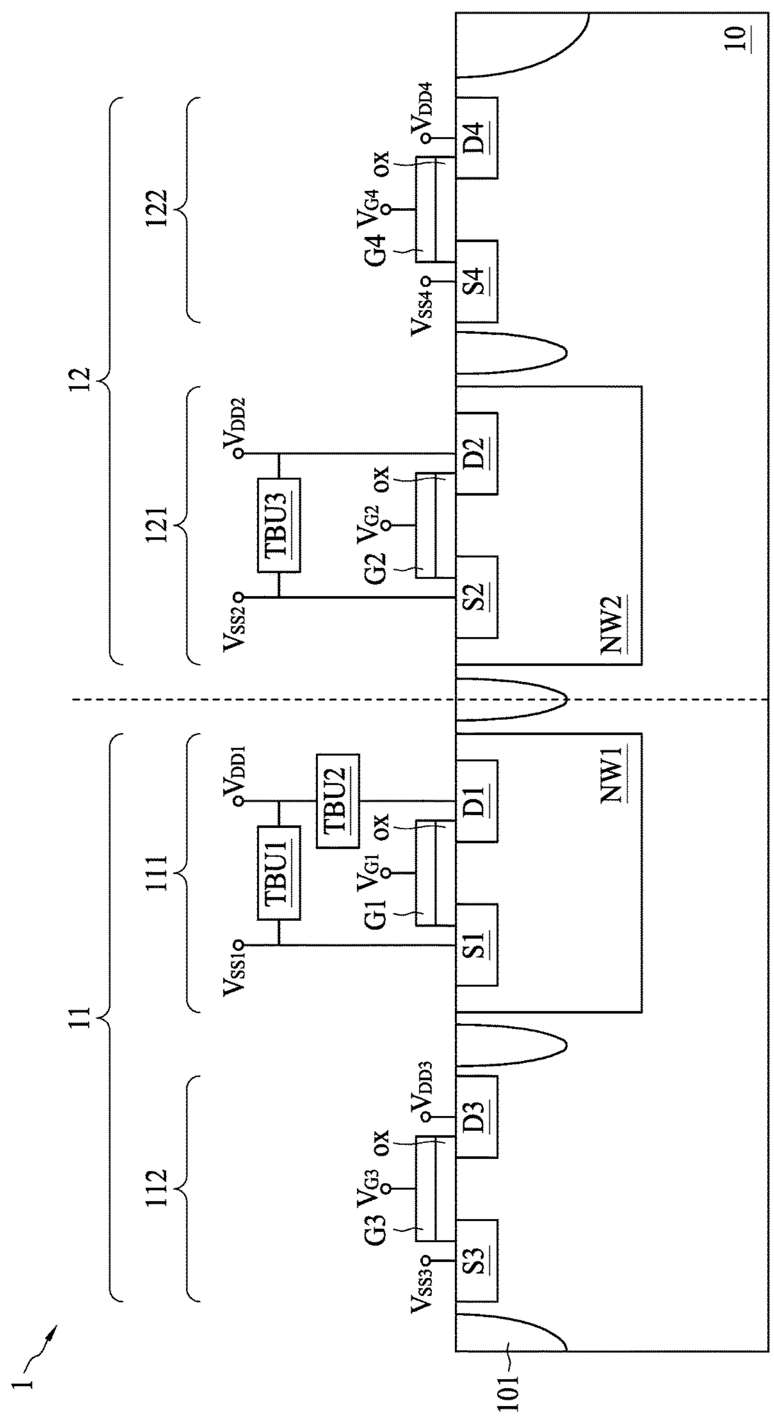
FIG. 2A illustrates a schematic cross-sectional view of the semiconductor device in FIG. 1 taken along a line AA', in accordance with some embodiments of the present disclosure.

FIG. 2A illustrates a schematic cross-sectional view of the semiconductor device 1 in FIG. 1 taken along a line AA', in accordance with some embodiments of the present disclosure. Referring to FIG. 2A, the semiconductor device 1 includes a semiconductor substrate 10, shallow trench isolation (STI) regions 101, and CMOS transistors 11 and 12.

The semiconductor substrate 10 may be but is not limited to, for example, a silicon substrate. The semiconductor substrate 10 may be a p-type substrate having an impurity concentration in the range of $1\times10^{14}$ to $5\times10^{15}$ carriers per cubic centimeter.

Shallow trench isolation (STI) regions 101 are formed in the semiconductor substrate 10. The STI regions 101 are provided to isolate transistors (111, 112, 121, 122 as will be described in detail below) electrically from neighboring semiconductor components such as transistors (not shown in FIG. 2A). Suitable materials for the STI regions 101 may, for example, include oxide (e.g., Ge oxide), oxynitride (e.g., GaP oxynitride), silicon dioxide (SiO2), nitrogen-bearing oxide (e.g., nitrogen-bearing $SiO_2$), nitrogen-doped oxide (e.g., $N_2$-implanted $SiO_2$), silicon oxynitride ($Si_xO_yN_z$), and the like. The STI regions 101 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like.

CMOS transistor 11 includes a PMOS transistor 111 and an NMOS transistor 112. Likewise, CMOS transistor 12 includes a PMOS transistor 121 and an NMOS transistor 122.

The PMOS transistor 111 includes an n-well NW1 in the semiconductor substrate 10, and the PMOS transistor 121 includes an n-well NW2 in the semiconductor substrate 10. A dopant (not shown) may be implanted to introduce dopant atoms and/or molecules into the semiconductor substrate 10 to form $N^+$-doped regions NW1 and NW2 in the semiconductor substrate 10. A dose of the dopant atoms and/or molecules such as boron (B) may range from approximately $1.0\times10^{15}$ to $5.0\times10^{15}$ ions/cm$^2$ for a PMOS transistor. An implant energy of the dopant atoms and/or molecules may range from approximately 30 to 100 keV. In another embodiment, a dose of the dopant atoms is approximately $1.0\times10^{15}$ ions/cm$^2$ of phosphorous (P) for an NMOS transistor or B for a PMOS transistor at an implant energy of approximately 30 keV.

It is contemplated that the n-well region NW1 may have a relatively smaller doping concentration than that of n-well region NW2. Moreover, it is contemplated that the n-well regions NW1 and NW2 may include different dopants.

The PMOS transistor 111 may include a source region S1 and a drain region D1 in the n-well NW1, while the PMOS transistor 121 may include a source region S2 and a drain region D2 in the n-well NW2. Likewise, the NMOS transistor 112 may include a source region S3 and a drain region D3 in the semiconductor substrate 10, while the NMOS transistor 122 may include a source region S4 and a drain region D4 in the semiconductor substrate 10.

A patterned dielectric layer OX may be formed by a variety of known techniques for forming such layers, e.g., chemical vapor deposition (CVD), low-pressure CVD (LP-CVD), plasma-enhanced CVD (PECVD), sputtering and physical vapor deposition (PVD), thermal growing, and the like. The patterned dielectric layer OX may have a thickness above an upper surface of the semiconductor substrate 10 ranging up to approximately 50 Å, for example, and may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The patterned dielectric layer OX may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. The patterned dielectric layer OX may have an equivalent oxide thickness $t_{ox-eq}$ ranging up to approximately 50 Å, for example. An equivalent oxide thickness $t_{ox-eq}$ may be defined to be the thickness t of a dielectric material (with a dielectric constant K) that would have a capacitance per unit area C that is approximately the same as the capacitance per unit area $C_{ox}$ that a thickness $t_{ox-eq}$ of silicon dioxide ($SiO_2$) would have. Since $SiO_2$ has a dielectric constant $K_{ox}$ of approximately 4, and since $C=K/t$ and $C_{ox}=K_{ox}/t_{ox-eq}$, then $t=K/C=K/C_{ox}=Kt_{ox-eq}/K_{ox}=K_{tox-eq}/4$ approximately. For example, the patterned dielectric layer OX may be formed of a tantalum oxide ($Ta_xO_y$, e.g., $Ta_2O_5$) with a dielectric constant $K_{TaO}$ of approximately 24. Then, using $t=K_{TaO}/C=K_{TaO}/C_{ox}$ and $t=K_{TaO}t_{ox-eq}/K_{ox}=24t_{ox-eq}/4$, approximately, an equivalent oxide thickness $t_{ox-eq}$ ranging up to approximately 50 Å would correspond to a $Ta_2O_5$ thickness $t_{TaO}$ ranging up to approximately 300 Å.

The PMOS transistor 111 may include a gate region G1 on the patterned dielectric layer OX, while the PMOS transistor 121 may include a gate region G2 on the patterned dielectric layer OX. Likewise, the NMOS transistor 112 may include a gate region G3 on the patterned dielectric layer OX, while the NMOS transistor 122 may include a gate region G4 on the patterned dielectric layer OX.

The PMOS transistor 111 may include a transient block unit TBU1 and a transient block unit TBU2. Transient block unit TBU1 has two terminals, where one terminal is electrically connected to the source region S1 and the other terminal is electrically connected to transient block unit TBU2. Transient block unit TBU2 has two terminals, where one terminal is electrically connected to the drain region D1 and the other terminal is electrically connected to transient block unit TBU1.

The transient block unit TBU1 may include, for example but is not limited to, a clamping circuit, e.g., an RC-triggered inverter NMOS clamping circuit, to protect wires, traces, components that electrically connected to a $V_{ss1}$ pad or a $V_{DD1}$ pad from a transient event.

The source region S1 of the PMOS transistor 111 is electrically connected to the $V_{ss1}$ pad. Transient block unit TBU2 is electrically connected between the $V_{DD1}$ pad and the drain region D1. Transient block unit TBU1 is connected between the $V_{ss1}$ pad and the $V_{DD1}$ pad.

The source region S2 of the PMOS transistor 121 is electrically connected to a $V_{ss2}$ pad. The drain region D2 of the PMOS transistor 121 is electrically connected to a $V_{DD2}$ pad. The PMOS transistor 121 may include a transient block unit TBU3. Transient block unit TBU3 is electrically connected between the $V_{ss2}$ pad and the $V_{DD2}$ pad. The transient block unit TBU3 may include, for example but is not limited to, a clamping circuit, e.g., an RC-triggered inverter NMOS clamping circuit, to protect wires, traces, components that electrically connected to the $V_{ss2}$ pad and the $V_{DD2}$ pad from a transient event.

The n-well NW1 is close to the n-well NW2 and separated by the STI region 101. The n-well NW1 may have a smaller doping concentration than that of the n-well NW2. The n-well NW1 of the PMOS transistor 111 may receive a relatively high voltage level (e.g. 20 volts) signal from the $V_{DD1}$ pad while the n-well NW2 of the PMOS transistor 121 may receive a relatively low voltage level (e.g. 5 volts) signal from the $V_{DD2}$ pad. In some embodiments of the present disclosure, the n-well NW1 of the PMOS transistor 111 may receive a higher voltage level (e.g. 65 volts) signal from the $V_{DD1}$ pad. It is contemplated that the n-well NW1 of the PMOS transistor 111 and the n-well NW2 of the PMOS transistor 121 may receive a same voltage level signal from the $V_{DD1}$ pad and the $V_{DD2}$ pad, respectively.

Figure 2B:
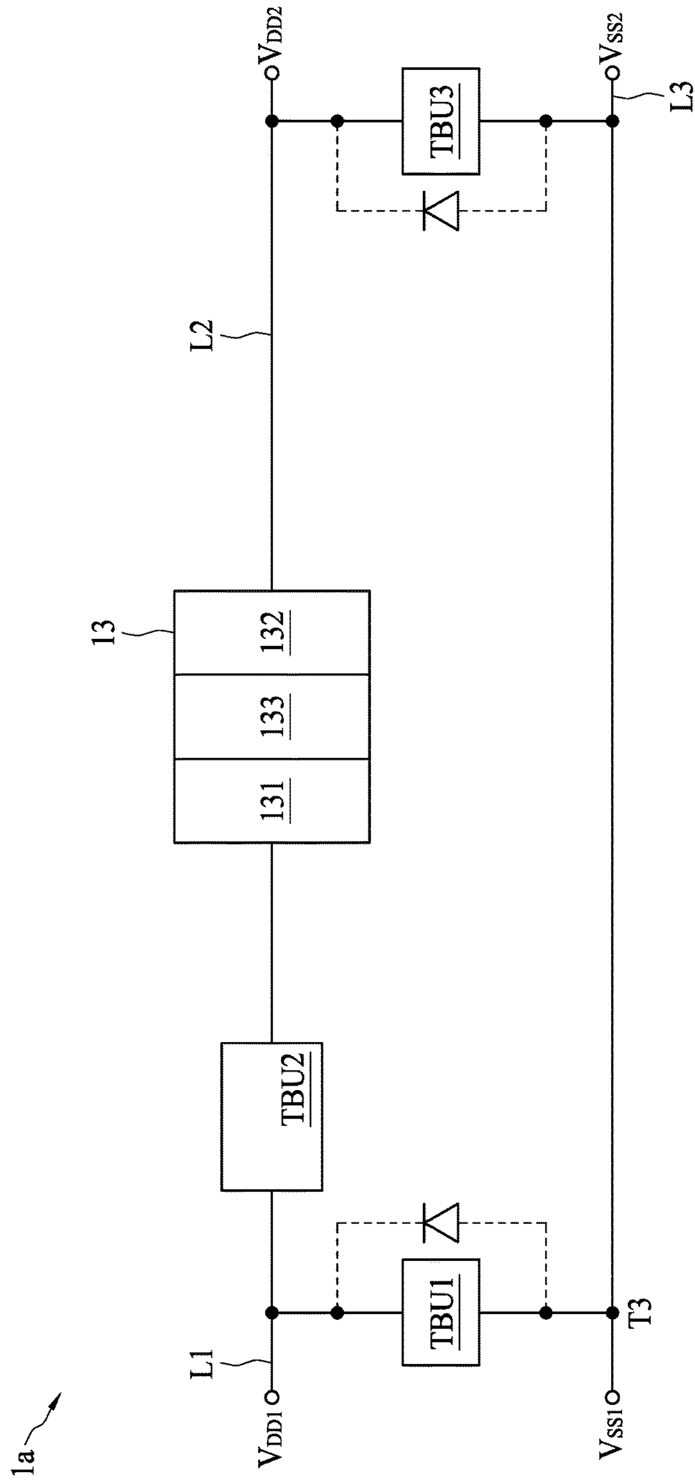
FIG. 2B illustrates a schematic circuit diagram of an equivalent circuit of the semiconductor device shown in FIG. 2A, in accordance with some embodiments of the present disclosure.

FIG. 2B illustrates a schematic circuit diagram of an equivalent circuit 1*a* of the semiconductor device 1 shown in FIG. 2A, in accordance with some embodiments of the present disclosure. Referring to FIG. 2B, the semiconductor circuit 1 includes, in addition to the transient block unit TBU1, transient block unit TBU2 and transient block unit TBU3, a parasitic bipolar junction transistor (BJT) 13, a power rail L1, a power rail L2 and a power rail L3.

Power rail L1 is electrically connected to the $V_{DD1}$ pad. Power rail L2 is electrically connected to the $V_{DD2}$ pad. Power rail L3 is electrically connected to the $V_{ss1}$ pad and the $V_{ss2}$ pad.

The parasitic BJT 13 may include an n-doped region 131 (e.g. NW1), a p-doped region (e.g. the semiconductor substrate 10) and an n-doped region 132 (e.g. NW2). It is contemplated that the semiconductor device 1 may include other parasitic BJTs. For convenience, only parasitic BJT 13 is discussed. In the present embodiment, the parasitic BJT 13 is a PNP transistor. The parasitic BJT 13 has a turn-on voltage 41 (shown in FIG. 7A) when the $V_{DD1}$ pad receives a relatively high voltage level signal while the $V_{DD2}$ pad receives a relatively low voltage level signal.

Integrated circuits (ICs) may be severely damaged by electrostatic discharge (ESD) events. As a result, ESD event is taken into consideration during the design phase of ICs. With the advance of IC fabrication technologies, more and more circuit blocks are integrated in a single chip. Consequently, interface circuits between separated power domains in an IC are often damaged by ESD stresses.

ESD is a concern to an IC before the IC is installed into a larger circuit assembly, such as a printed circuit board (PCB), and before the PCB is connected to an operating power. This susceptible period includes production, storage, transport, handling, and installation.

A source of ESD exposure to ICs is from the human body (the "Human Body Model", HBM). The discharge of the human body generates peak currents of several amperes to the IC for about 100 nanoseconds (ns). Another source of ESD is from metallic objects (the "Machine Model", MM), which may generate transients with significantly higher rise times and current levels than the HBM ESD source.

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

Transient block unit TBU1 is electrically connected between the power rail L1 and the power rail L3. Transient block unit TBU1 may include, for example but is not limited to, a clamping circuit, e.g., an RC-triggered inverter NMOS clamping circuit, to protect wires, traces, components that electrically connected to the $V_{ss1}$ pad and the $V_{DD1}$ pad from an ESD event. Transient block unit TBU1 may be devised, for example, to pass a minimum voltage level of 2 KV in Human Body Model and a minimum voltage level of 200V in Machine model. During an ESD test where the $V_{DD1}$ pad receives a test signal and the $V_{DD2}$ pad is grounded, transient block unit TBU1 may receive a maximum voltage level signal $V_{t1}$. Moreover, transient block unit TBU1 may have a forward voltage $V_{f1}$. Transient block unit TBU1 may function as a diode (shown in dotted line).

Transient block unit TBU3 is electrically connected between the power rail L2 and the power rail L3. Transient block unit TBU3 may have a forward voltage $V_{f3}$. Transient block unit TBU3 may function as a diode (shown in dotted line).

Transient block unit TBU2 is electrically connected between the $V_{DD1}$ pad and the n-doped region 131 of the parasitic BJT 13. Transient block unit TBU2 may have a forward voltage $V_{f2}$ and a breakdown voltage $V_{bv2}$.

Figure 2C:
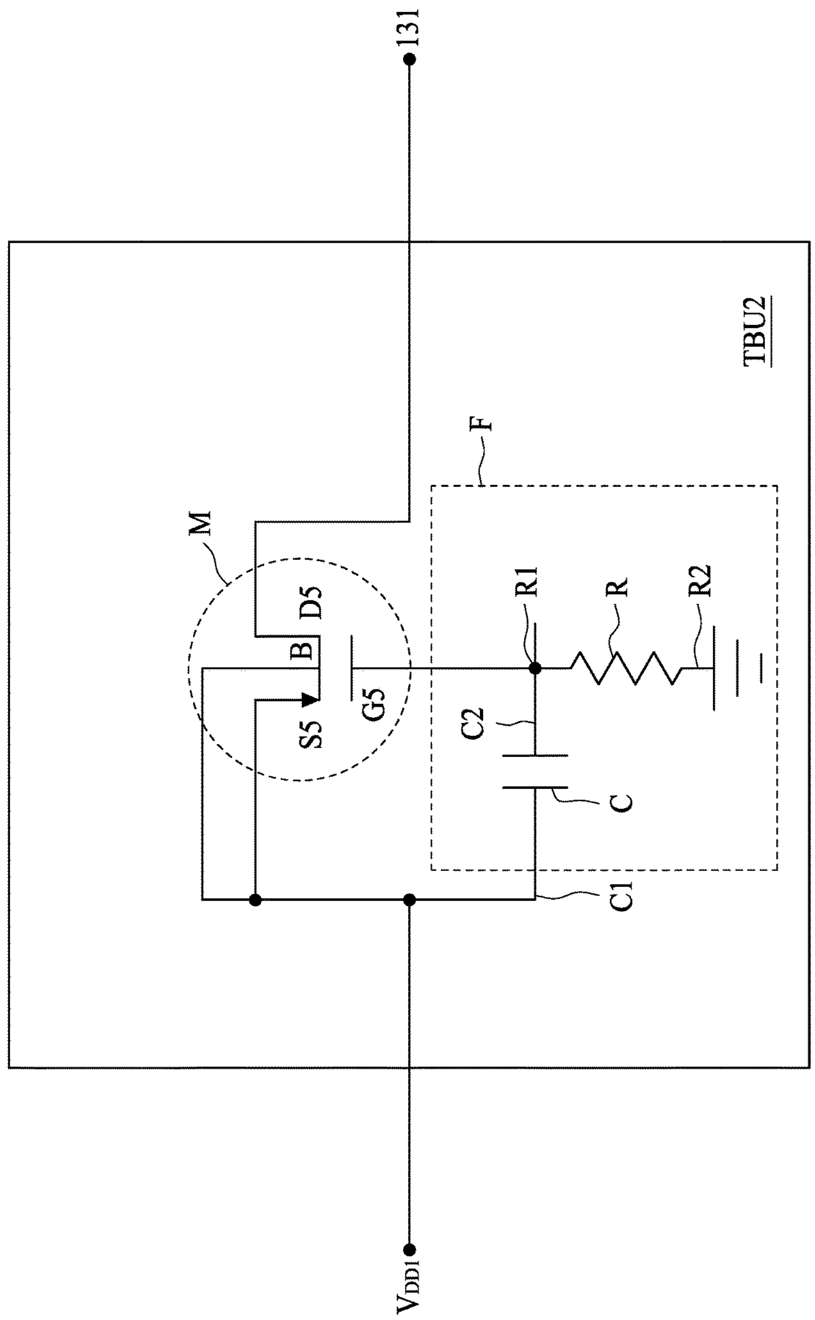
FIG. 2C illustrates a transient block unit of the semiconductor device shown in FIG. 2B, in accordance with some embodiments of the present disclosure.

FIG. 2C illustrates the transient block unit TUB2 of the semiconductor device 1 shown in FIG. 2B in accordance with some embodiments of the present disclosure.

Referring to FIG. 2C, the transient block unit TBU2 includes a metal-oxide-semiconductor field-Effect transistor (MOSFET) M and a filter F. The MOSFET M may include but is not limited to a PMOSFET. The MOSFET M has a source terminal $S_5$, a gate terminal $G_5$, a drain terminal $D_5$ and a body terminal B connected to the source terminal $S_5$. The drain terminal $D_5$ of the MOSFET M is electrically connected to the n-doped region 131 of the parasitic BJT 13. The source terminal $S_5$ is electrically connected to the $V_{DD1}$ pad. It is contemplated that the MOSFET M may include an NMOSFET in some embodiments of the present disclosure.

The filter F includes a capacitor C and a resistor R connected in series between $V_{DD1}$ and ground. The capacitor C has terminals C1 and C2, where terminal C1 is electrically connected to a source terminal S5 of the MOSFET M and the terminal C2 is electrically connected to the resistor R and the gate terminal $G_5$ of the MOSFET M. The resistor R has terminals R1 and R2, where terminal R1 is electrically connected to terminal C2 of the capacitor C and the gate terminal $G_5$ of the MOSFET M, and terminal R2 is grounded.

When the semiconductor device 1 shown in FIG. 2A or the semiconductor circuit 1*a* shown in FIG. 2B is in normal operation or under an ESD test, the gate terminal $G_5$ of the MOSFET M is pulled down (to the ground or zero voltage) to turn on the MOSFET M. As a result, the transient block unit TBU2 does not interfere with the normal operation of the semiconductor device 1.

When an ESD event occurs, the ESD signal may pass the filter F, which causes the gate terminal $G_5$ and the source terminal S5 of the MOSFET M to be at the same voltage level, and thus turns off the MOSFET M. For example, the resistor R may have a resistance of 300 kiloohms (kΩ) and the capacitor C may have a capacitance of 1 picofarad (pF). Effectively, the resistor R works with the capacitor C to deal with an ESD event having a duration of approximately 300 ns.

Referring back to FIG. 2B, the transient block unit TBU2 may be operated to protect the semiconductor circuit 1*a* from an ESD event. When the semiconductor circuit 1*a* is under an ESD test, the $V_{DD1}$ pad receives a power signal 41' (shown in FIG. 8) and the $V_{DD2}$ pad is grounded. The power signal 41' does not turn on the parasitic BJT 13 until the voltage level of the power signal 41' is greater than a sum of the turn-on voltage 41 of the parasitic BJT 13 and the breakdown voltage $V_{bv2}$ of the transient block unit TBU2.

Referring back to FIG. 1, under a condition that the n-well NW1 of the PMOS transistor 111 receives a relatively high voltage level (e.g. 20 volts) from the $V_{DD1}$ pad while the n-well NW2 of the PMOS transistor 121 receives a relatively low voltage level (e.g. 5 volts) from the $V_{DD2}$ pad, a minimum distance or space S1 to separate the n-well region NW1 from the n-well region NW2 is approximately 10-20 micrometers (μm).

In some embodiments of the present disclosure, when the n-well NW1 of the PMOS transistor 111 receives a relatively higher voltage level (e.g. 65 volts) from the $V_{DD1}$ pad, a minimum distance or space S1 to separate the n-well region NW1 from the n-well region NW2 is approximately 40-60 micrometers (μm).

Figure 2D:
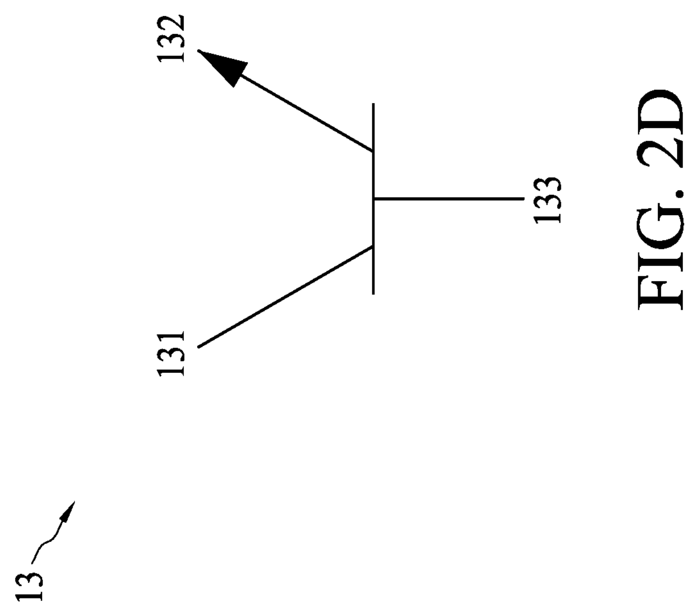
FIG. 2D illustrates a symbol of a parasitic BJT shown in FIG. 2B in accordance with some embodiments of the present disclosure.

FIG. 2D illustrates a symbol of the parasitic BJT 13 as shown in FIG. 2B in accordance with some embodiments of the present disclosure. Referring to FIG. 2D, the parasitic BJT 13 includes a collector 131, a base 133 and an emitter 132. Moreover, the n-well NW1, the substrate 10 and the n-well NW2 serve as the collector 131, base 133 and emitter 132 of the parasitic BJT 13, respectively.

Figure 3A:
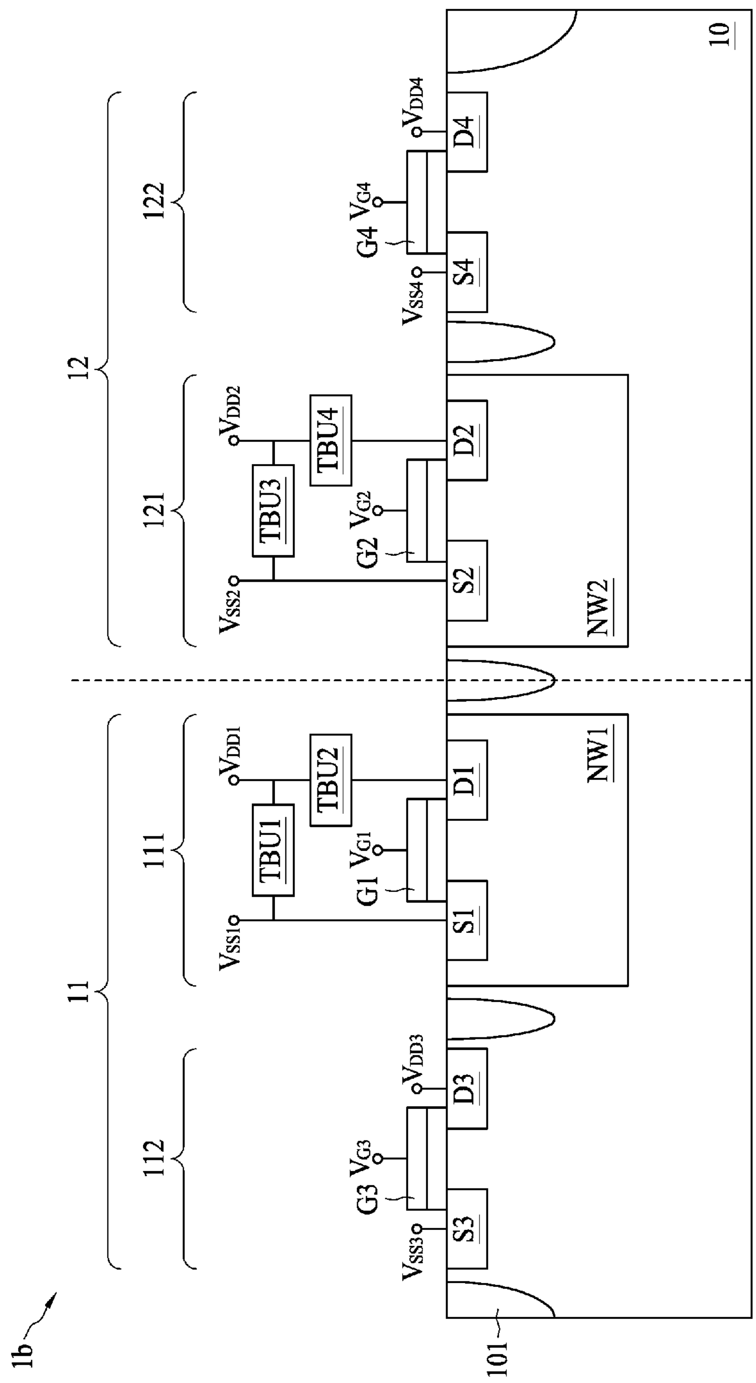
FIG. 3A illustrates a schematic cross-sectional view of another semiconductor device in accordance with some embodiments of the present disclosure.

FIG. 3A illustrates a schematic cross-sectional view of another semiconductor device 1*b* in accordance with some embodiments of the present disclosure.

Referring to FIG. 3A, the semiconductor device 1*b* is similar to the semiconductor device 1 as illustrated and described with reference to FIG. 2A, except that the PMOS transistor 121 further includes a transient block unit TBU4. Transient block unit TBU4 has two terminals, where one terminal is electrically connected to the drain region D2 and the other terminal is electrically connected to transient block unit TBU3.

Figure 3B:
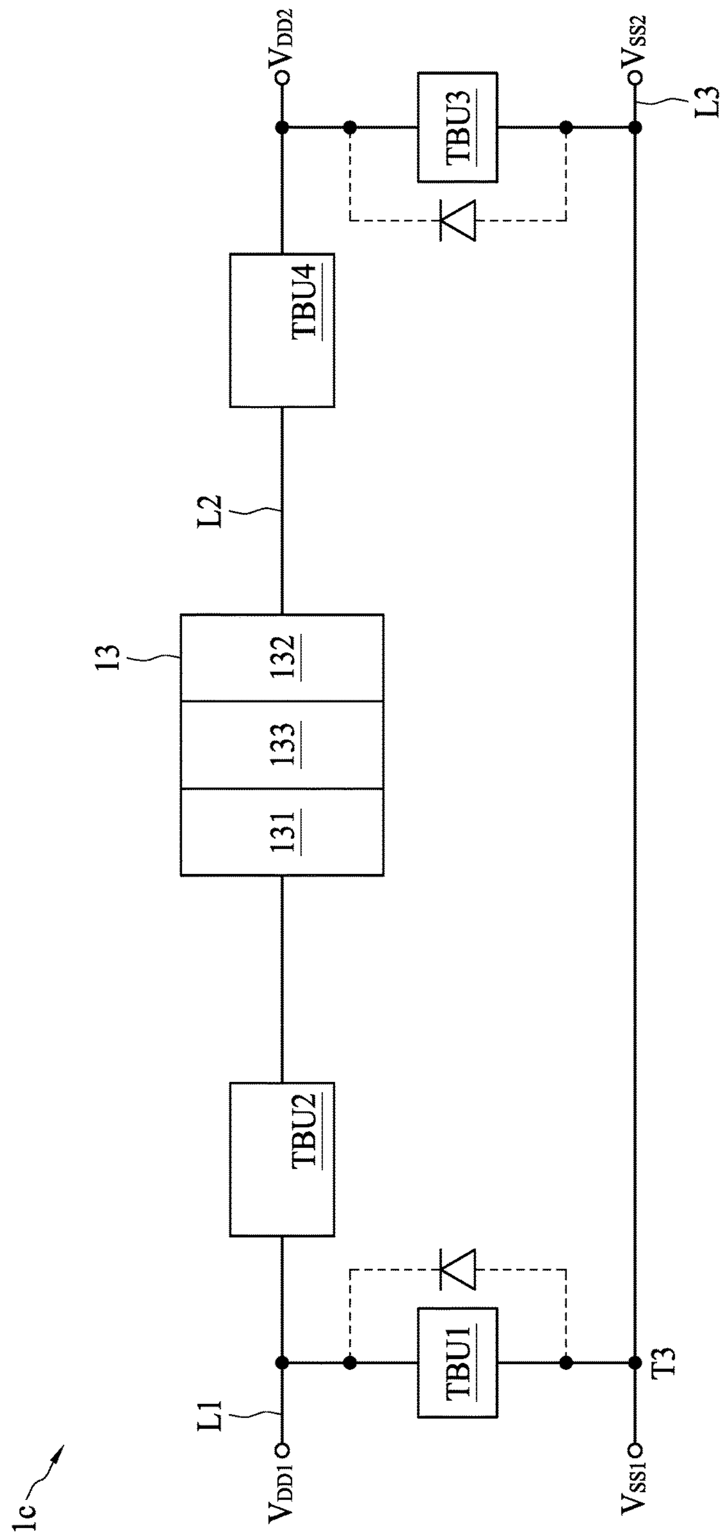
FIG. 3B illustrates a schematic circuit diagram of an equivalent circuit of the semiconductor device shown in FIG. 3A, in accordance with some embodiments of the present disclosure.

FIG. 3B illustrates a schematic circuit diagram of an equivalent circuit 1*c* of the semiconductor device 1*b* shown in FIG. 3A, in accordance with some embodiments of the present disclosure.

Referring to FIG. 3B, the semiconductor circuit 1*c* is similar to the semiconductor circuit 1*a* as illustrated and described with reference to FIG. 2B, except that the semiconductor circuit 1*c* further includes the transient block unit TBU4, which is electrically connected between the $V_{DD2}$ pad and the n-doped region 132 of the parasitic BJT 13. Transient block unit TBU4 may have a forward voltage $V_{f4}$ and a breakdown voltage $V_{bv4}$. The parasitic BJT 13 may have a turn-on voltage 42 (shown in FIG. 7B) when the $V_{DD2}$ pad receives a relatively high voltage level signal while the $V_{DD1}$ pad receives a relatively low voltage level signal.

The transient block unit TBU4 may be operated to protect the semiconductor circuit 1*c* from an ESD event. When the semiconductor circuit 1*c* is under an ESD test, the $V_{DD2}$ pad receives a power signal 42' (shown in FIG. 9) and the $V_{DD1}$ pad is grounded. The power signal 42' does not turn on the parasitic BJT 13 until the voltage level of the power signal 42' is greater than a sum of the turn-on voltage 42 of the parasitic BJT 13, the forward voltage $V_{f2}$ of transient block unit TBU2 and the breakdown voltage $V_{bv4}$ of the Transient block unit TBU4.

The transient block unit TBU2 may be operated to protect the semiconductor circuit 1*c* from an ESD event. When the semiconductor circuit 1*c* is under an ESD test, the $V_{DD1}$ pad receives a power signal 41" (shown in FIG. 9) and the $V_{DD2}$ pad is grounded. The power signal 41" does not turn on the parasitic BJT 13 until the voltage level of the power signal 41" is greater than a sum of the turn-on voltage 41 of the parasitic BJT 13, the forward voltage $V_{f4}$ of the transient block unit TBU4 and the breakdown voltage $V_{bv2}$ of the transient block unit TBU2.

Transient block unit TBU3 is electrically connected between the power rail L2 and the power rail L3. Transient block unit TBU3 may include, for example but is not limited to, a clamping circuit, e.g., an RC-triggered inverter NMOS clamping circuit, to protect wires, traces, components that electrically connected to the $V_{ss2}$ pad or the $V_{DD2}$ pad from an ESD event. Transient block unit TBU3 may be devised, for example, to pass a minimum voltage level of 2 KV in Human Body Model and a minimum voltage level of 200V in Machine model. During an ESD test where the $V_{DD2}$ pad receives a test signal and the $V_{DD1}$ pad is grounded, transient block unit TBU3 may receive a maximum voltage level signal $V_{t3}$. Transient block unit TBU3 may have a forward voltage $V_{f3}$.

Figure 3C:
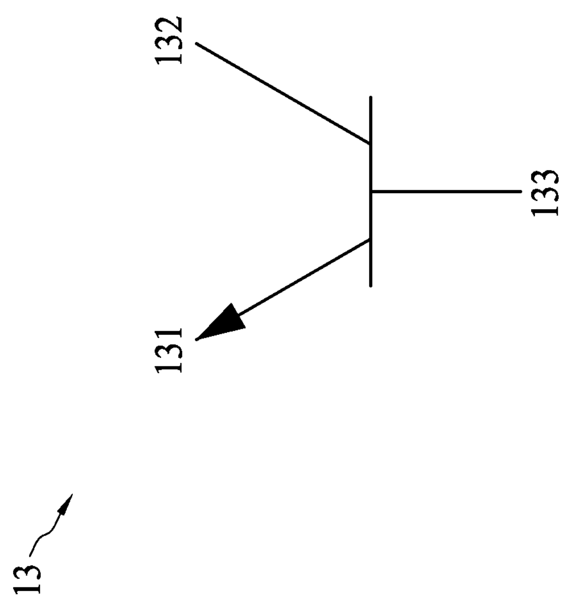
FIG. 3C illustrates a symbol of a parasitic BJT shown in FIG. 3B in accordance with some embodiments of the present disclosure.

FIG. 3C illustrates a symbol of the parasitic BJT 13 shown in FIG. 3B in accordance with some embodiments of the present disclosure. Referring to FIG. 3C, the parasitic BJT 13 includes a collector 132, a base 133 and an emitter 131. Moreover, the n-well NW1, the substrate 10 and the n-well NW2 serve as the emitter 131, base 133 and collector 132 of the parasitic BJT 13, respectively.

Figure 4:
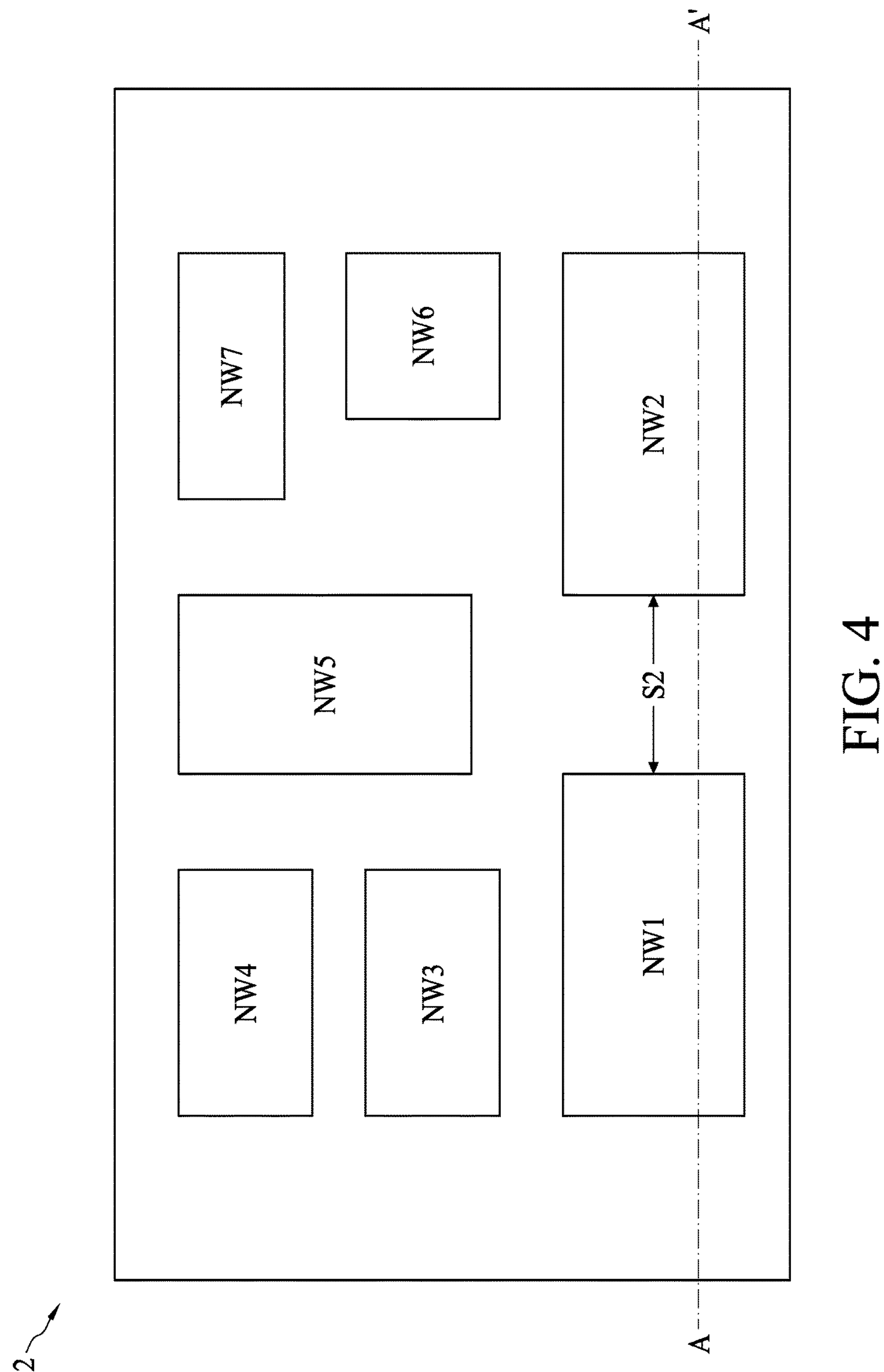
FIG. 4 illustrates a layout view of another semiconductor device in accordance with some embodiments of the present disclosure.

FIG. 4 illustrates a layout view another semiconductor device 2 in accordance with some embodiments of the present disclosure. Referring to FIG. 4, the semiconductor device 2 is similar to the semiconductor device 1 as illustrated and described with reference to FIG. 1, except that the distance or space S2 among the n-type well regions NW1, NW2, NW3, NW4, NW5, NW6 and NW7 is relatively greater than S1 as shown in FIG. 1.

Figure 5:
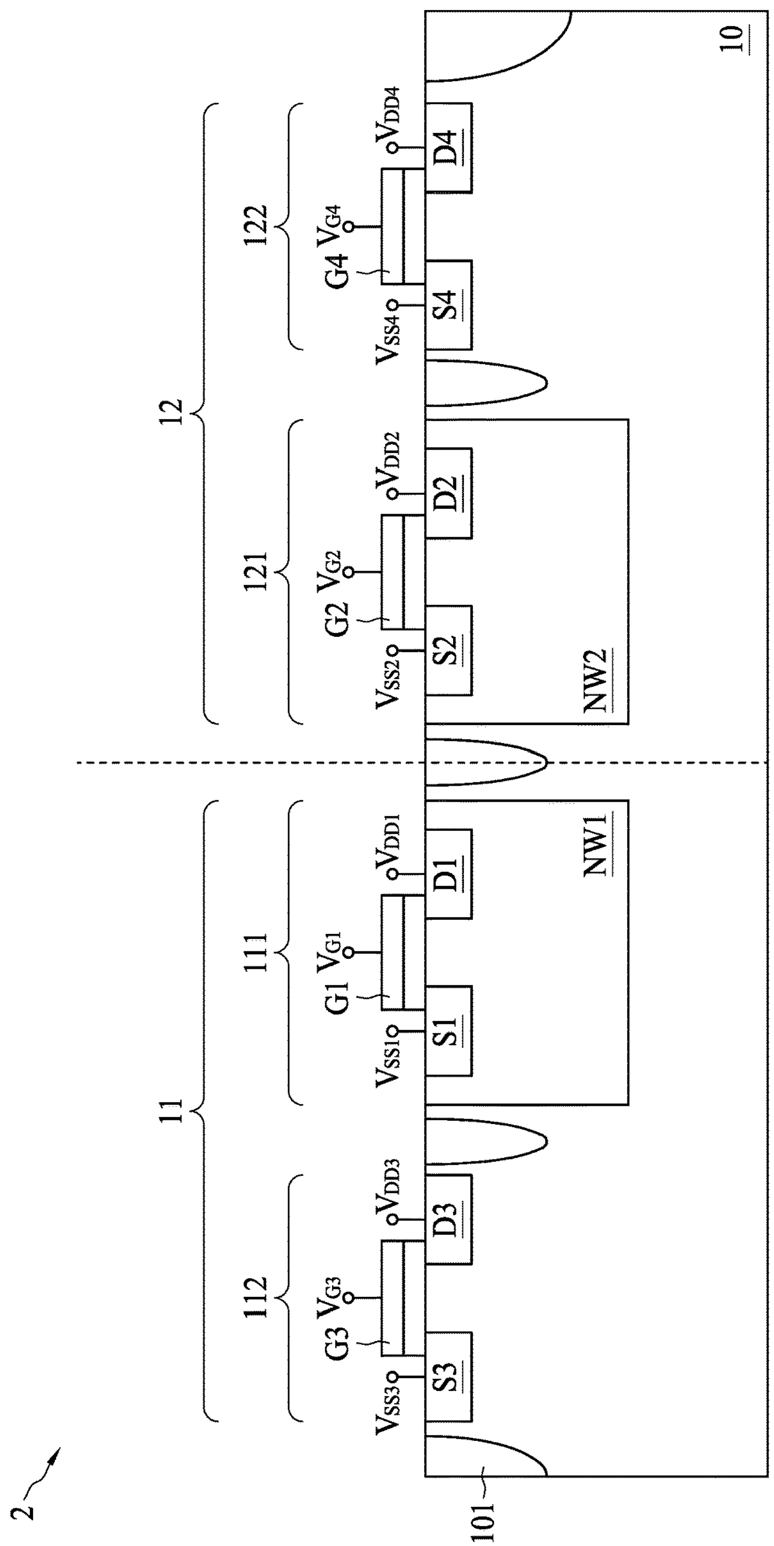
FIG. 5 illustrates a schematic cross-sectional view of the semiconductor device in FIG. 4 taken along a line AA', in accordance with some embodiments of the present disclosure.

FIG. 5 illustrates a schematic cross-sectional view of the semiconductor device 2 in FIG. 4 taken along a line AA', in accordance with some embodiments of the present disclosure. Referring to FIG. 5, the semiconductor device 2 is similar to the semiconductor device 1 as illustrated and described with reference to FIG. 2A, except that the transient block units TBU1, TBU2 and TBU 3 are eliminated.

Figure 6:
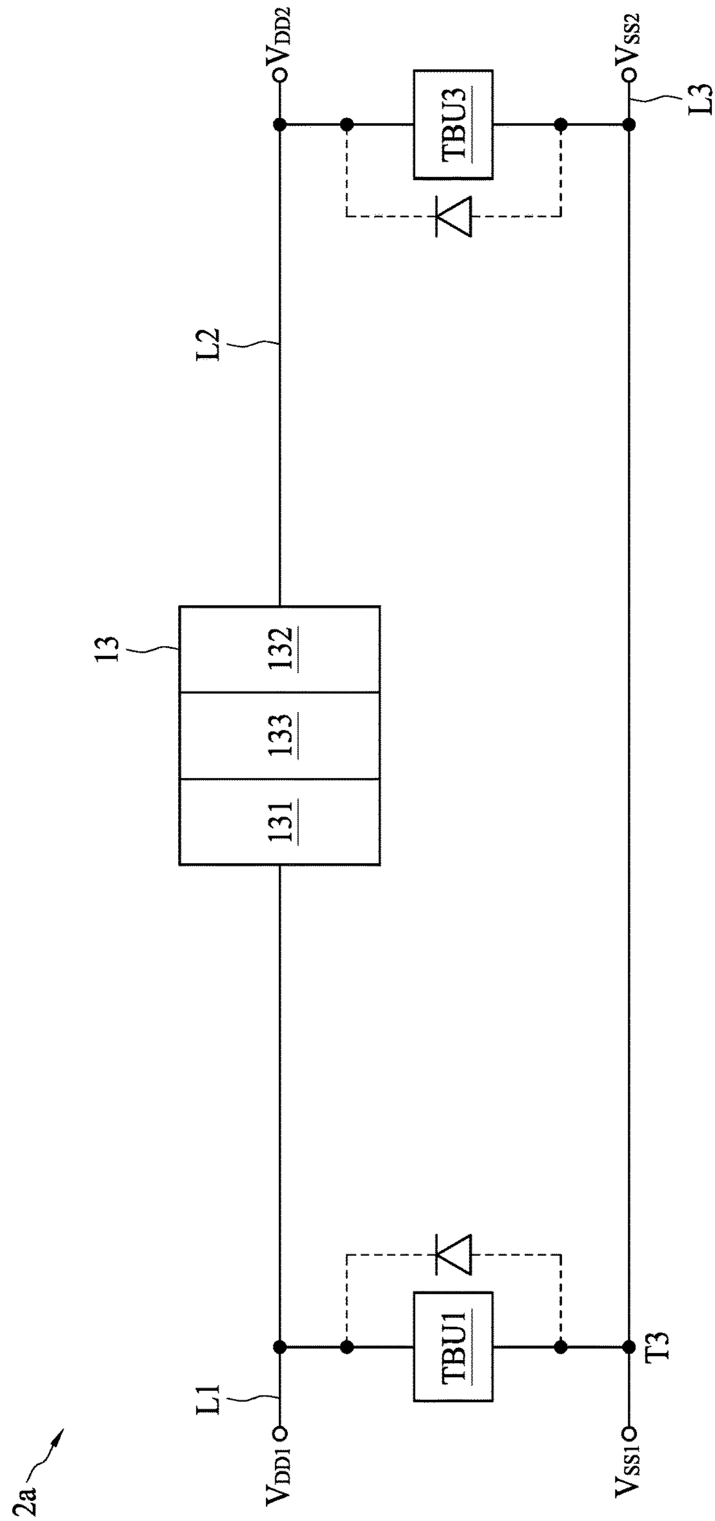
FIG. 6 illustrates a schematic circuit diagram of an equivalent circuit of the semiconductor device shown in FIG. 5, in accordance with some embodiments of the present disclosure.

FIG. 6 illustrates a schematic circuit diagram of an equivalent circuit 2*a* of the semiconductor device 2 shown in FIG. 5, in accordance with some embodiments of the present disclosure. Referring to FIG. 6, the semiconductor circuit 2*a* is similar to the semiconductor circuit 1*a* as illustrated and described with reference to FIG. 2B, except that the transient block units TBU1, TBU2 and TBU 3 are eliminated. Distance or space between neighboring n-type wells or p-type wells may therefore be increased to avoid triggering the parasitic BJT 13.

Referring back to FIG. 4, under a condition that the n-well NW1 of the PMOS transistor 111 receives a relatively high voltage level (e.g. 20 volts) from the $V_{DD1}$ pad while the n-well NW2 of the PMOS transistor 121 receives a relatively low voltage level (e.g. 5 volts) from the $V_{DD2}$ pad, a minimum distance or space S2 to separate the n-well region NW1 from the n-well region NW2 is approximately 10-20 micrometers (μm).

In some embodiments of the present disclosure, when the n-well NW1 of the PMOS transistor 111 receives a higher voltage level (e.g. 65 volts) from the $V_{DD1}$ pad, a minimum distance or space S2 to separate the n-well region NW1 from the n-well region NW2 is approximately 65 to 130 micrometers (μm).

Figure 7A:
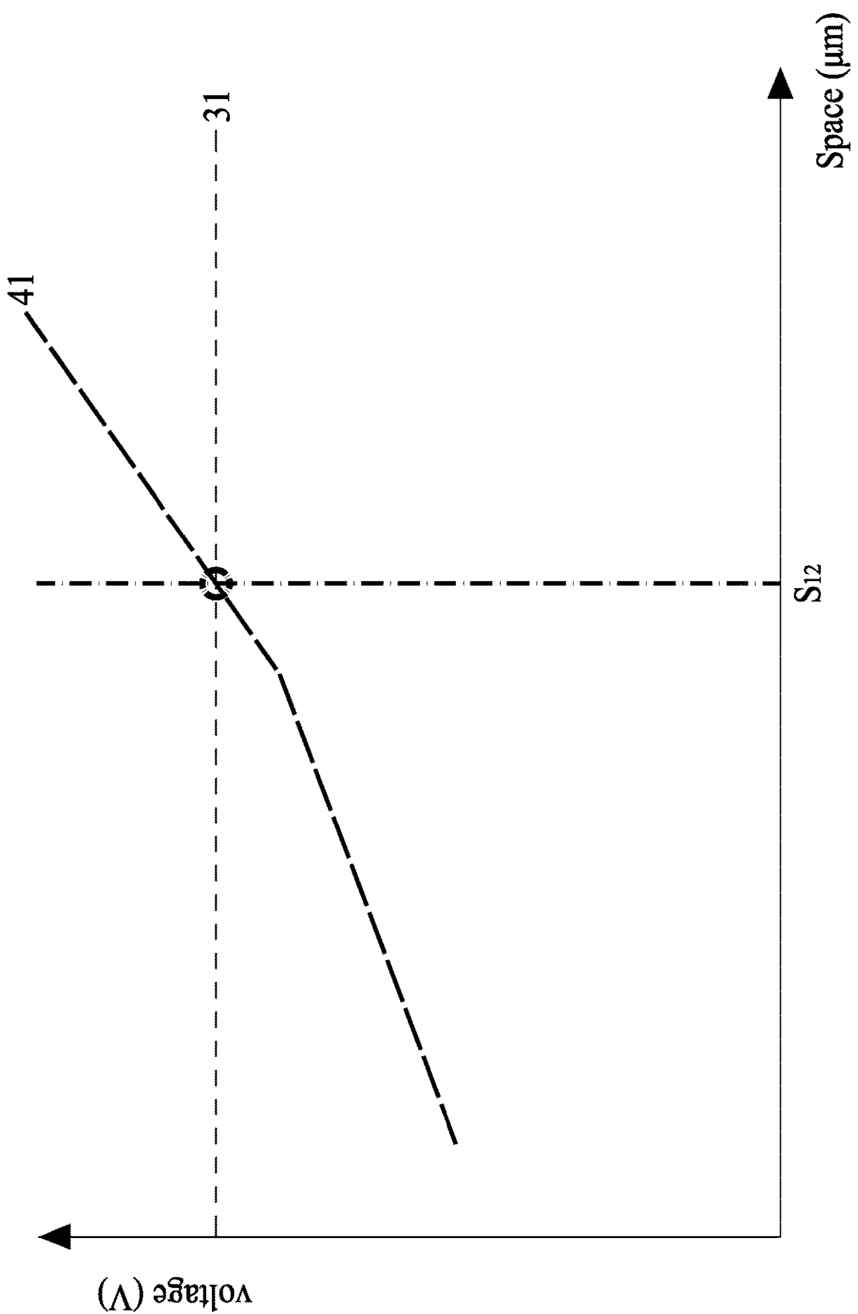
FIG. 7A illustrates relation of voltage applied on a parasitic BJT to space separating two polar regions of the parasitic BJT in accordance with some embodiments of the present disclosure.

FIG. 7A illustrates the relation between voltage applied to a parasitic BJT and space separating two polar regions of the parasitic BJT in accordance with some embodiments of the present disclosure. Referring to FIG. 7A, the horizontal axis represents a space that separates the n-well region NW1 from the n-well region NW2 as shown in FIG. 4, and the vertical axis represents a voltage applied to the $V_{DD1}$ pad as shown in FIG. 5 and FIG. 6.

Line 31 represents a sum of the maximum voltage level signal $V_{t1}$ received at the $V_{DD1}$ pad and the forward voltage $V_{f3}$ of the transient block unit TBU3 during an ESD test on the semiconductor circuit 2*a* (as shown in FIG. 6), where the $V_{DD1}$ pad receives a test signal and the $V_{DD2}$ pad is grounded.

Line 41 represents the turn-on voltage 41 of the parasitic BJT 13 when the $V_{DD1}$ pad receives a relatively high voltage level signal while the $V_{DD2}$ pad receives a relatively low voltage level signal (e.g. ground signal). The turn-on voltage 41 of the parasitic BJT 13 is dependent on the space that separates the n-well region NW1 from the n-well region NW2 as shown in FIG. 4. If the turn-on voltage 41 of the parasitic BJT 13 is greater than the sum of the maximum voltage level signal $V_{t1}$ and the forward voltage $V_{f3}$ of the transient block unit TBU3 (e.g. the voltage indicated by line 31), the parasitic BJT 13 is not turned on. Accordingly, a minimum space $S_{12}$, which can be obtained at an intersection of lines 31 and 41, is required to keep the parasitic BJT 13 "off" during an ESD test.

Figure 7B:
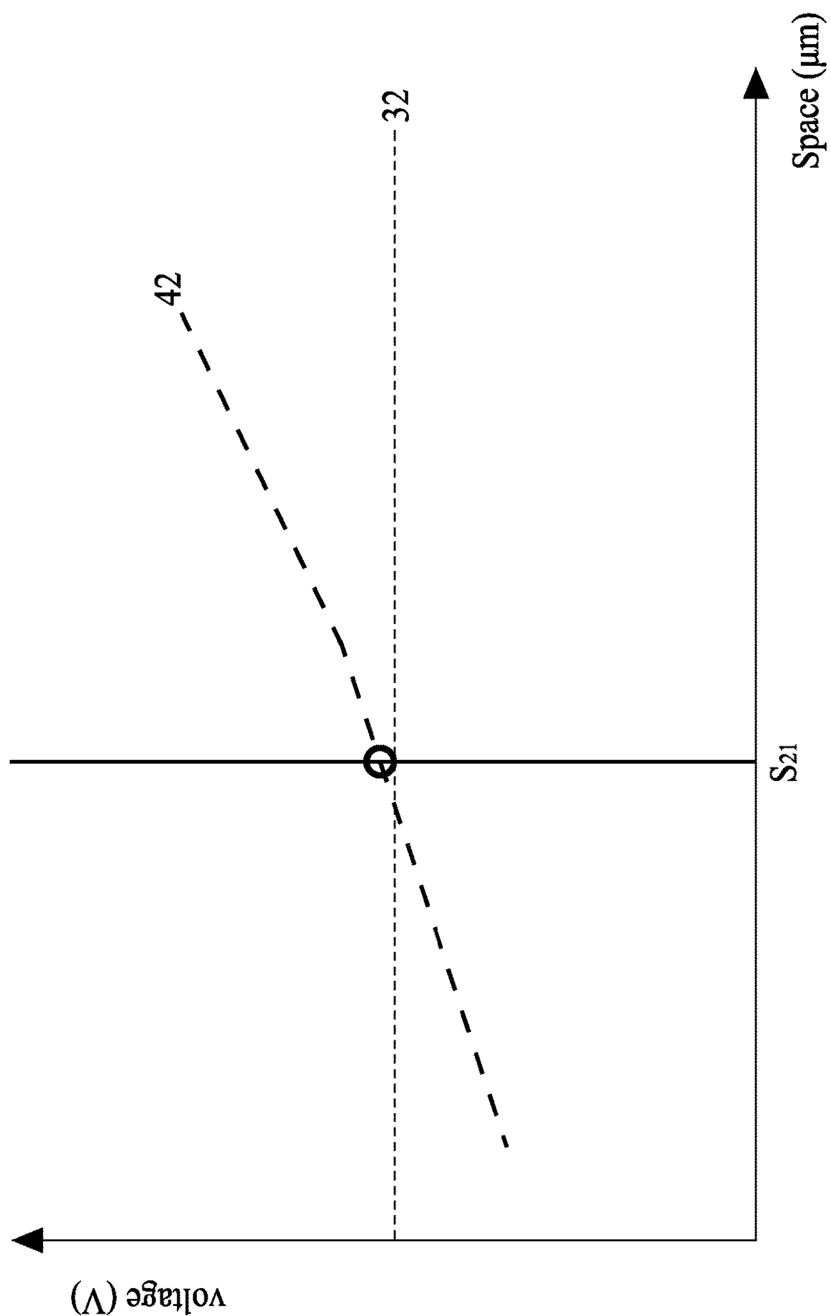
FIG. 7B illustrates relation of voltage applied on a parasitic BJT to space separating two polar regions of the parasitic BJT in accordance with some embodiments of the present disclosure.

FIG. 7B illustrates the relation between voltage applied to a parasitic BJT and space separating two polar regions of the parasitic BJT 13 in accordance with some embodiments of the present disclosure.

Referring to FIG. 7B, the horizontal axis represents a space that separates the n-well region NW1 from the n-well region NW2 as shown in FIG. 4, and the vertical axis represents a voltage applied to the $V_{DD2}$ pad as shown in FIG. 5 and FIG. 6.

Line 32 represents a sum of the maximum voltage level signal $V_{t3}$ received at the $V_{DD2}$ pad and the forward voltage $V_{f1}$ of the transient block unit TBU1 during an ESD test on the semiconductor circuit 2*a* (as shown in FIG. 6), where the $V_{DD2}$ pad receives a test signal and the $V_{DD1}$ pad is grounded.

Line 42 represents the turn-on voltage 42 of the parasitic BJT 13 when the $V_{DD2}$ pad receives a relatively high voltage level signal while the $V_{DD1}$ pad receives a relatively low voltage level signal (e.g. ground signal). The turn-on voltage 42 of the parasitic BJT 13 is dependent on the space that separates the n-well region NW1 from the n-well region NW2 as shown in FIG. 4. If the turn-on voltage 42 of the parasitic BJT 13 is greater than the sum of the maximum voltage level signal $V_{t3}$ received at the $V_{DD2}$ pad and the forward voltage $V_{f1}$ of the transient block unit TBU1 (e.g. the voltage indicated by line 32), the parasitic BJT 13 is not turned on. Accordingly, a minimum space $S_{21}$, which can be obtained at an intersection of lines 32 and 42, is required to keep the parasitic BJT 13 "off" during an ESD test.

Figure 7C:
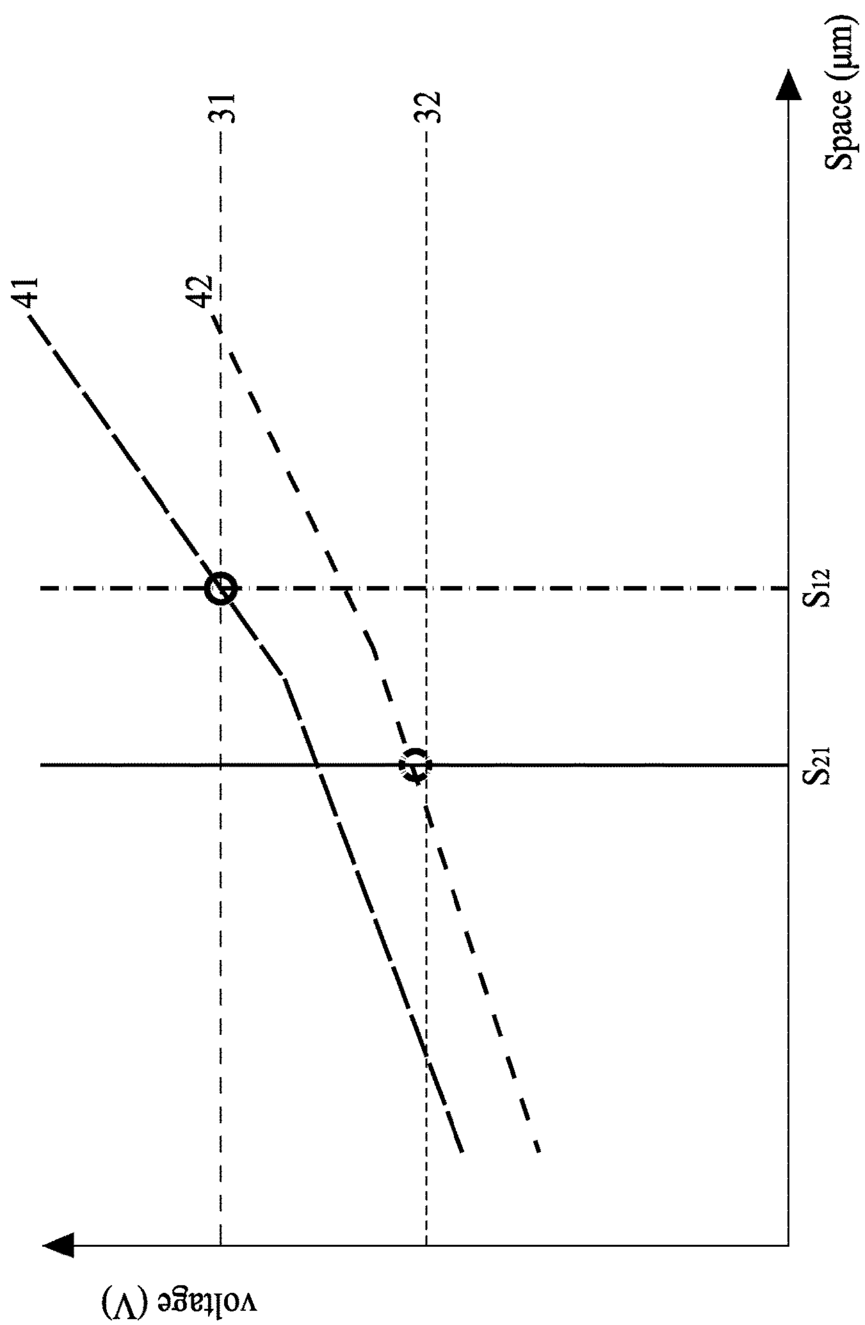
FIG. 7C illustrates relation of voltage applied on a parasitic BJT to space separating two polar regions of the parasitic BJT in accordance with some embodiments of the present disclosure.

FIG. 7C illustrates the relation between voltage applied to a parasitic BJT and space separating two polar regions of the parasitic BJT 13 in accordance with some embodiments of the present disclosure.

Referring to FIG. 7C, lines 31 and 41 as shown in FIG. 7A and lines 32 and 42 as shown in FIG. 7B are put together in FIG. 7C for explanation. The greater one or the greatest one of the space $S_{12}$ and $S_{21}$ is determined to keep the parasitic BJT 13 "off" during an ESD test. In FIG. 7C, the space $S_{12}$ is greater than the space $S_{21}$. Accordingly, the space $S_{12}$ is determined as S2 as shown in FIG. 4, which is used to separate the n-well region NW1 from the n-well region NW2.

Figure 8:
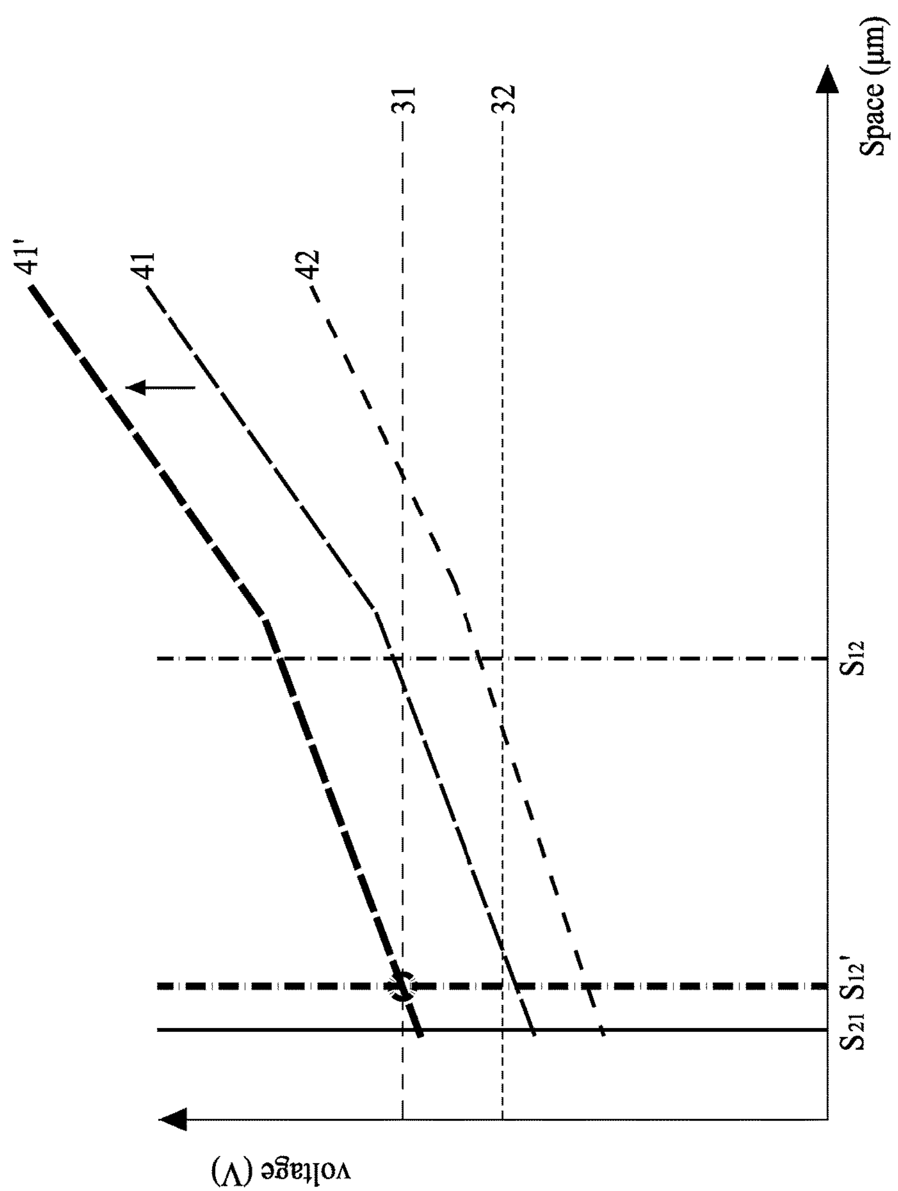
FIG. 8 illustrates relation of voltage applied on a parasitic BJT to space separating two polar regions of the parasitic BJT in accordance with some embodiments of the present disclosure.

FIG. 8 illustrates the relation between voltage applied to a parasitic BJT and space separating two polar regions of the parasitic BJT 13 in accordance with some embodiments of the present disclosure.

Referring to FIG. 8, the diagram is similar to that illustrated and described with reference to FIG. 7C, except that FIG. 8 further illustrates a line 41'.

The line 41' represents a power signal 41' received at the $V_{DD1}$ pad when the semiconductor circuit 1*a* (as shown in FIG. 2B) is under an ESD test, wherein the $V_{DD2}$ pad is grounded. The line 41' represents a sum of the turn-on voltage 41 of the parasitic BJT 13 and the breakdown voltage $V_{bv2}$ of the transient block unit TBU2.

If the voltage level of the power signal 41' is greater than the sum of the maximum voltage level signal $V_{t1}$ and the forward voltage $V_{f3}$ of the transient block unit TBU3 (e.g., the voltage indicated by line 31), the parasitic BJT 13 is not turned on. Accordingly, a minimum space $S_{12}'$, which can be obtained at an intersection of lines 31 and 41', is required to keep the parasitic BJT 13 "off" during an ESD test.

It can be observed in FIG. 8 that the voltage level received at the $V_{DD1}$ pad is pulled up from line 41 to line 41', which means the space to keep the parasitic BJT 13 "off" can be reduced from $S_{12}$ to $S_{12}'$. Note that the space $S_{21}$ is smaller than the space $S_{12}'$, and accordingly the space $S_{12}'$ is determined as S1 as shown in FIG. 1, which is used to separate the n-well region NW1 from the n-well region NW2.

Figure 9:
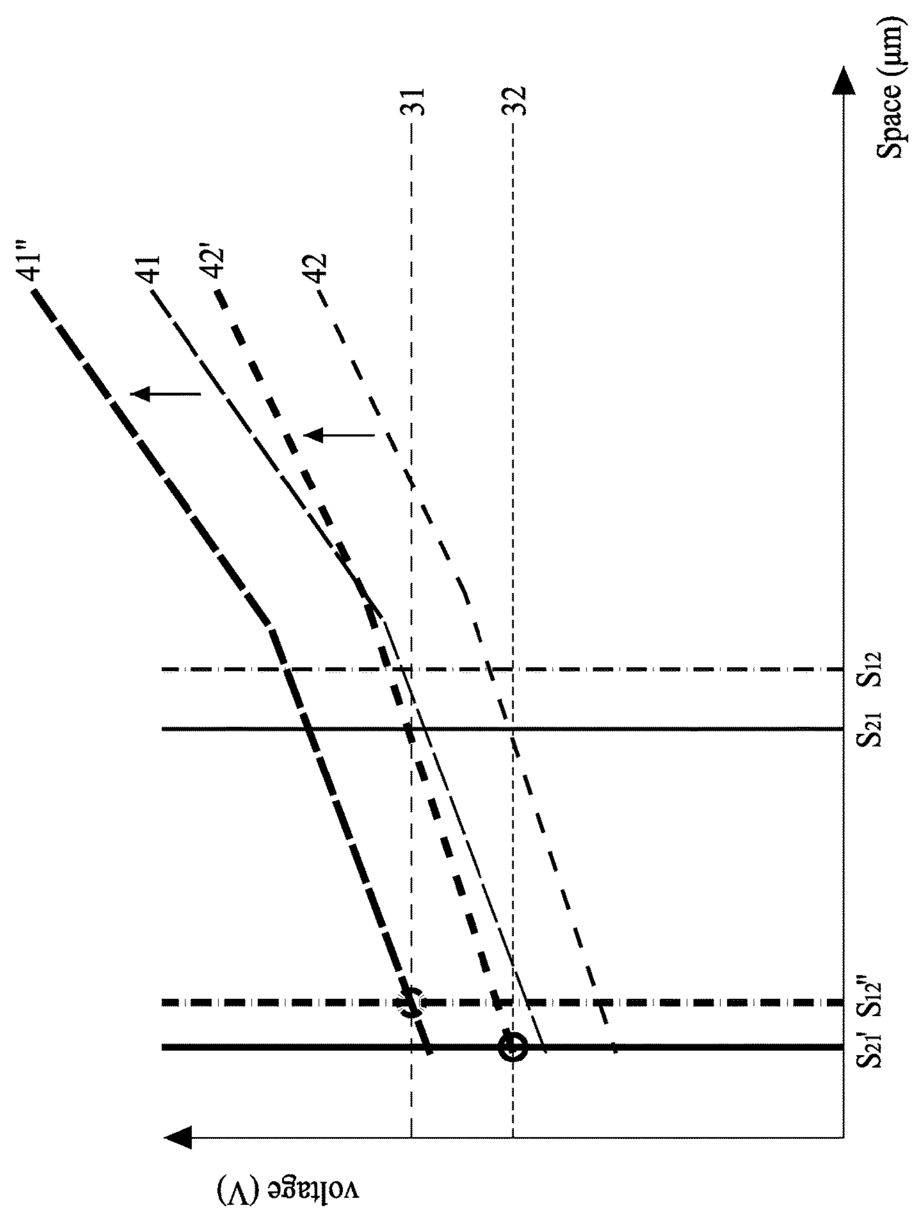
FIG. 9 illustrates relation of voltage applied on a parasitic BJT to space separating two polar regions of the parasitic BJT in accordance with some embodiments of the present disclosure.

FIG. 9 illustrates the relation between voltage applied to a parasitic BJT and space separating two polar regions of the parasitic BJT 13 in accordance with some embodiments of the present disclosure.

Referring to FIG. 9, the diagram is similar to that illustrated and described with reference to FIG. 7C, except that FIG. 9 further illustrates lines 41" and 42'.

The line 41" represents a power signal 41" received at the $V_{DD1}$ pad when the semiconductor circuit 1*c* (as shown in FIG. 3B) is under an ESD test, wherein the $V_{DD2}$ pad is grounded. The line 41" represents a sum of the turn-on voltage 41 of the parasitic BJT 13, the forward voltage $V_{f4}$ of the transient block unit TBU4 and the breakdown voltage $V_{bv2}$ of the transient block unit TBU2.

If the voltage level of the power signal 41" is greater than the sum of the maximum voltage level signal $V_{t1}$ and the forward voltage $V_{f3}$ of the transient block unit TBU3 (e.g., the voltage indicated by line 31), the parasitic BJT 13 is not turned on. Accordingly, a minimum space $S_{12}''$, which can be obtained at an intersection of lines 31 and 41", is required to keep the parasitic BJT 13 "off" during an ESD test.

It can be observed in FIG. 9 that the voltage level received at the $V_{DD1}$ pad is pulled up from line 41 to line 41", which means the space to keep the parasitic BJT 13 "off" can be reduced from $S_{12}$ to $S_{12}''$.

Line 42' represents a power signal 42' received at the $V_{DD2}$ pad when the semiconductor circuit 1*c* (as shown in FIG. 3B) is under an ESD test, wherein the $V_{DD1}$ pad is grounded. The line 42' represents a sum of the turn-on voltage 42 of the parasitic BJT 13, the forward voltage $V_{f2}$ of transient block unit TBU2 and the breakdown voltage $V_{bv4}$ of the Transient block unit TBU4.

If the voltage level of the power signal 42' is greater than the sum of the maximum voltage level signal $V_{t3}$ received at the $V_{DD2}$ pad and the forward voltage $V_{f1}$ of the transient block unit TBU1 (e.g., the voltage indicated by line 32), the parasitic BJT 13 is not turned on. Accordingly, a minimum space $S_{21}$', which can be obtained at an intersection of lines 32 and 42', is required to keep the parasitic BJT 13 "off" during an ESD test.

It can be observed in FIG. 9 that the voltage level received at the $V_{DD2}$ pad is pulled up from line 42 to line 42' which means the space to keep the parasitic BJT 13 "off" can be reduced from $S_{21}$ to $S_{21}$'.

In FIG. 9, the greater one or the greatest one of the space $S_{12}$" and $S_{21}$' is determined to keep the parasitic BJT 13 "off" during an ESD test. In FIG. 9, the space $S_{12}$" is greater than the space $S_{21}$', and accordingly the space $S_{12}$" is determined as S1 as shown in FIG. 1, which is used to separate the n-well region NW1 from the n-well region NW2.

Figure 10:
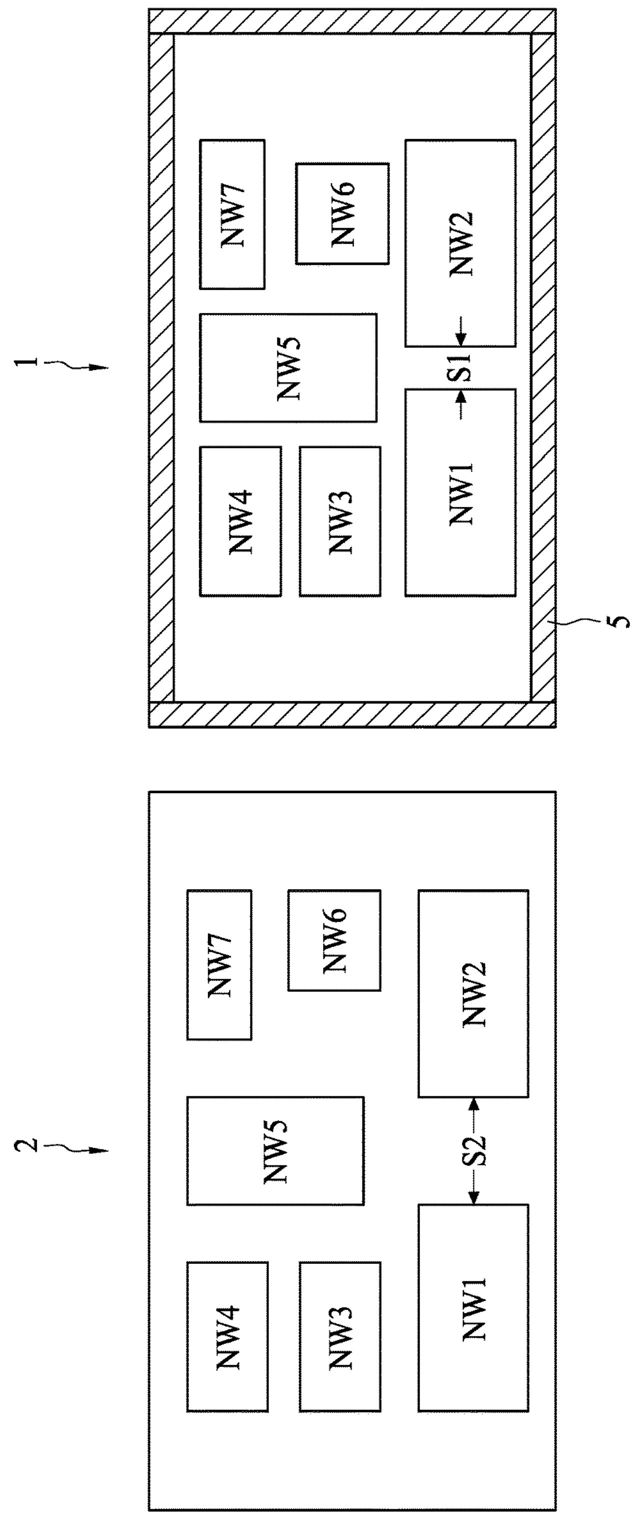
FIG. 10 illustrates relation of semiconductor device shown in FIG. 1 to s semiconductor device shown in FIG. 4 in accordance with some embodiments of the present disclosure.

FIG. 10 illustrates the relation between semiconductor device shown in FIG. 1 and semiconductor device shown in FIG. 4 in accordance with some embodiments of the present disclosure.

Referring to FIG. 10, as compared to the semiconductor device 2 illustrated and described with reference to FIG. 4, space 5 of the semiconductor device 2 can be saved or reserved for other circuit arrangements. Space 5 may be a difference between the space S1 and the space S2.

In accordance with some embodiments of the present disclosure, a semiconductor device includes a substrate, a first doping region, a second doping region, a third doping region, a first transient block unit and a second transient block unit. The first doping region is in the substrate. The second doping region is in the first doping region. The third doping region is in the first doping region. The first transient block unit is electrically connected to the second doping region. The second transient block unit is electrically connected between the third doping region and the first transient block unit.

In accordance with some embodiments of the present disclosure, a semiconductor circuit includes a parasitic bipolar junction transistor, a first power rail and a first transient block unit. The parasitic bipolar junction transistor has a first terminal and a second terminal. The first transient block unit is connected between the first terminal of the parasitic BJT and the first power rail.

In accordance with some embodiments of the present disclosure, a transient blocking device includes a PMOSFET and a filter. The PMOSFET has a source terminal, a gate terminal and a drain terminal connected to a parasitic bipolar junction transistor. The filter is connected between the source terminal and the gate terminal of the PMOSFET. The filter shorts the source terminal and the gate terminal of the PMOSFET when a transient event occurs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
- a substrate;
- a first doping region in the substrate;
- a second doping region in the first doping region;
- a third doping region in the first doping region;
- a first transient block unit electrically connected to the second doping region; and
- a second transient block unit electrically connected between the third doping region and the first transient block unit, wherein the second transient block unit comprises:
  - a field-effected transistor, having a source terminal, a gate terminal, and a drain terminal, wherein the source terminal electrically connects to the first transient block unit, and the drain terminal electrically connects to the third doping region;
  - a capacitor, having a first terminal electrically connected to the source terminal, and a second terminal electrically connected to the gate terminal; and
  - a resistor, having a first terminal electrically connected to the gate terminal and a second terminal electrically connected to a reference voltage level.

2. The semiconductor device of claim 1, further comprising a fourth doping region close to the first doping region in the substrate.

3. The semiconductor device of claim 2, wherein the first doping region and the fourth doping region comprise a first dopant.

4. The semiconductor device of claim 3, wherein the substrate comprises a second dopant different from the first dopant, and the first doping region and the fourth doping region are separated by a portion of the substrate.

5. The semiconductor device of claim 1, wherein the first transient block unit comprises a clamping circuit.

6. The semiconductor device of claim 1, wherein the field-effected transistor is a Metal-Oxide-Semiconductor Field-Effect Transistor (MOSFET) , and the capacitor and the resistor are arranged to be a filter.

7. The semiconductor device of claim 6, wherein the MOSFET is a PMOSFET.

8. The semiconductor device of claim 1, wherein the gate terminal and the source terminal of the field-effected transistor are at the same voltage level when an ESD event occurs.

9. The semiconductor device of claim 1, wherein the field-effected transistor is turned off when an ESD event occurs.

10. The semiconductor device of claim 1, wherein the field-effected transistor is turned on during a normal operation of the semiconductor device.

11. The semiconductor device of claim 1, wherein a voltage of the gate terminal of the field-effected transistor is pulled to the reference voltage level during a normal operation of the semiconductor device.

12. A semiconductor circuit, comprising:
- a parasitic bipolar junction transistor having a first terminal and a second terminal;
- a first power rail; and
- a first transient block unit connected between the first terminal of the parasitic BJT and the first power rail, wherein the first transient block unit comprises:
  - a field-effected transistor, having a source terminal, a gate terminal, and a drain terminal, wherein the source terminal electrically connects to the first power rail, and the drain terminal electrically connects to the first terminal of the parasitic bipolar junction transistor;
  - a capacitor, having a first terminal electrically connected to the source terminal, and a second terminal electrically connected to the gate terminal; and a resistor, having a first terminal electrically connected to the gate terminal and a second terminal electrically connected to a reference voltage level.

13. The semiconductor circuit of claim 12, further comprising:

a second power rail; and a second transient block unit connected between the first power rail and the second power rail.

14. The semiconductor circuit of claim 12, further comprising:

a second power rail;

a third power rail;

a second transient block unit connected between the second power rail and the third power rail.

15. The semiconductor circuit of claim 12, further comprising:

a second power rail; and a second transient block unit connected between the second terminal of the parasitic BJT and the second power rail.

16. The semiconductor circuit of claim 12, wherein the field-effected transistor is a Metal-Oxide-Semiconductor Field-Effect Transistor (MOSFET) , and the capacitor and the resistor are arranged to be a filter.

17. The semiconductor circuit of claim 16, wherein the MOSFET is a PMOSFET.

18. The semiconductor circuit of claim 12, the field-effected transistor is turned off when an ESD event occurs.

19. The semiconductor circuit of claim 12, wherein the field-effected transistor is turned on during a normal operation of the semiconductor device.

20. A semiconductor circuit, comprising:

a first transient block unit, electrically connected to a first terminal of a PMOSFET;

a second transient block unit, electrically connected between a second terminal of the PMOSFET and the first transient block unit;

wherein the first transient block unit comprises:

a field-effected transistor, having a source terminal, a gate terminal, and a drain terminal, wherein the source terminal electrically connects to the second transient block unit, and the drain terminal electrically connects to the first terminal of the PMOSFET;

a capacitor, having a first terminal electrically connected to the source terminal and a second terminal electrically connected to the gate terminal; and a resistor, having a first terminal electrically connected to the gate terminal and a second terminal electrically connected to a reference voltage level.

* * * * *